United States Patent [19]

Weidler

[11] 4,448,467

[45] May 15, 1984

[54] CONNECTOR ASSEMBLY HAVING COMPACT KEYING AND LATCHING SYSTEM

[75] Inventor: Charles H. Weidler, Lancaster, Pa.

[73] Assignee: AMP Incorporated, Harrisburg, Pa.

[21] Appl. No.: 414,160

[22] Filed: Sep. 2, 1982

[51] Int. Cl.$^3$ .......................... H05K 1/00; H01R 13/62

[52] U.S. Cl. .............................. 339/17 LC; 339/91 R; 339/113 R; 339/186 M

[58] Field of Search ............ 339/91 R, 184 R, 184 M, 339/17 LC, 113 R, 186 R, 186 M

[56] References Cited

U.S. PATENT DOCUMENTS

| | | | |
|---|---|---|---|
| 3,112,974 | 12/1963 | Curtis et al. | 339/186 M X |
| 3,366,729 | 1/1968 | Pauza | 174/138 |
| 3,399,374 | 8/1968 | Pauza et al. | 339/91 |
| 3,562,696 | 2/1971 | Barnhart et al. | 339/60 |
| 3,569,909 | 3/1971 | Garver | 339/91 |
| 3,588,784 | 6/1971 | Kunkle et al. | 339/65 |
| 4,008,941 | 2/1977 | Smith | 339/17 LC X |
| 4,169,648 | 10/1979 | Moist, Jr. | 339/103 R |
| 4,192,568 | 3/1968 | Marks et al. | 339/91 R |
| 4,376,565 | 3/1983 | Bird et al. | 339/186 M |
| 4,379,606 | 4/1983 | Clark et al. | 339/91 R X |
| 4,405,193 | 9/1983 | Weidler | 339/99 R |
| 4,408,824 | 10/1983 | Weidler | 339/258 R |

FOREIGN PATENT DOCUMENTS 2021547 11/1971 Fed. Rep. of Germany ... 339/186 M

*Primary Examiner*—John McQuade
*Assistant Examiner*—Steven C. Bishop
*Attorney, Agent, or Firm*—Frederick W. Raring; Robert Usher

[57] ABSTRACT

Connector assembly comprises plug housing and receptacle housing. The plug housing has a latch arm hinged to one of its sidewalls having a forward portion which extends towards the mating end. A plurality of removable keys are mounted on the plug housing adjacent to the forward portion of the latch arm. The latch arm has an inspection opening to determine the presence or absence of the keys. Keying is achieved by removing one of the keys and placing a key plug in the corresponding keyway in the receptacle. The latch arm has a rearward portion which extends towards the rearward face of the housing. Clearance slots are provided in the rearward portion for wires which extend through the clearance openings, through wire-admitting slots in the housing sidewall and to terminals in the housing. The clearance slots permit the rearward portion of the latch arm to be depressed thereby to raise the forward portion when the plug housing is latched to, or unlatched from, the receptacle housing.

8 Claims, 4 Drawing Figures

CONNECTOR ASSEMBLY HAVING COMPACT KEYING AND LATCHING SYSTEM

FIELD OF THE INVENTION

This invention relates to electrical connector assemblies of the type comprising a plug housing and a receptacle housing with a keying system and a latch arm on one of the housings for keying the housings to each other and for latching them together when they are in a mated condition.

It is common practice to provide on electrical connector assemblies of the type comprising a plug housing and a receptacle hosing a latching means for latching the housings to each other when they are in a mated condition. It is also common practice to provide a keying system for keying a pair of housings so that neither of the housings can be mated with one of the housings of an adjacent connector assembly. The latching system often comprises a latch arm which is hinged to one of the connector housings and latch shoulders on the other housing. The keying system simply comprises keys on one of the housings and keyways in the other housing. Most of the available connector assemblies have keying systems or latching systems which cannot be located closely adjacent to each other. For example, if the latch arm is provided on one of the housing sidewalls, it is not possible with most latching systems to provide a keying system on or adjacent to the same sidewall. Ordinarily, the keys can be located remote from the latch arm and it is of no concern that the keys are spaced from the latch arm. However, when the housings of a connector assembly must be within minimum dimensions and where the housings must be such that they can be located in stacked relationship to identical housings, it becomes impractical to provide each connector assembly with both keying and latching systems. The present invention is directed to the achievement of a connector assembly having both a keying system and a latching system provided on one of the sidewalls of one of the housings. The invention is further directed to the achievement of a connector assembly having housings which can be located immediately adjacent to identical housings of an identical connector assembly.

An electrical connector assembly in accordance with the invention comprises first and second connector housings, each of the housings having a mating face, a rearward face, and external housing walls extending from the mating face to the rearward face. The external walls comprise oppositely facing sidewalls and oppositely facing endwalls. Terminals are contained in the housing and are coupled to each other when the housings are mated to each other. A latch arm is provided on one of the external housing walls of the first housing, the latch arm being hinged to the housing wall and having a forward portion which extends towards the mating face and a rearward portion which extends towards the rearward face. The forward portion has latching shoulder means thereon for cooperation with complementary latching shoulder means on the second housing. A keying system is provided on the housing for keying the housings to each other. A connector assembly in accordance with the invention is characterized in that the keying system comprises at least one removable key on the first housing and a keyway in the second housing. The key extends parallel to, and is adjacent to, the one external wall of the first housing on which the latch arm is mounted. The key is substantially coextensive with the forward portion of the latch arm and is located between the forward portion of the latch arm and the one external wall of the housing. The forward portion of the latch arm has an inspection opening therein to permit determination of the presence or absence of the removable key. In accordance with further embodiments, the latch arm is hinged to one of the sidewalls of the first housing and has a width which is substantially equal to the width of the first housing as measured between the endwalls. In accordance with a further embodiment, the first housing has a plurality of removable keys thereon and the inspection opening in a single opening located centrally between the side edges of the forward portion of the latch arm.

In accordance with a further embodiment, the first housing has a plurality of terminals therein in side-by-side spaced apart relationship. Each terminal has a wire-receiving portion which is proximate to, and spaced inwardly of, the rearward face of the housing. The one sidewall has wire-admitting slots therein which are aligned with the wire-receiving portions of the terminals so that wires can be moved laterally of the axes and into the wire-receiving portions of the terminals and the wires will then extend through the wire-admitting slots. The rearward portion of the latch arm extends past the wire-admitting slots and has a free end which is proximate to the rearward face of the housing. Wire clearance slots extend into the rearward portion of the latch arm from the free end thereof to provide clearance for the wires and to permit rocking motion of the latch arm when the housings are coupled or uncoupled from each other.

DESCRIPTION OF THE DRAWINGS

As shown in FIGS. 1 and 2, a connector assembly 2 in accordance with the invention serves to connect wires 4 to conductors 6 on the upper surface 8 of a circuit board 10 having a lower surface 12. The connector assembly 2 comprises a first housing 14 and a second housing 16, the first housing being a plug housing and the second housing being a receptacle housing.

Figure 2:
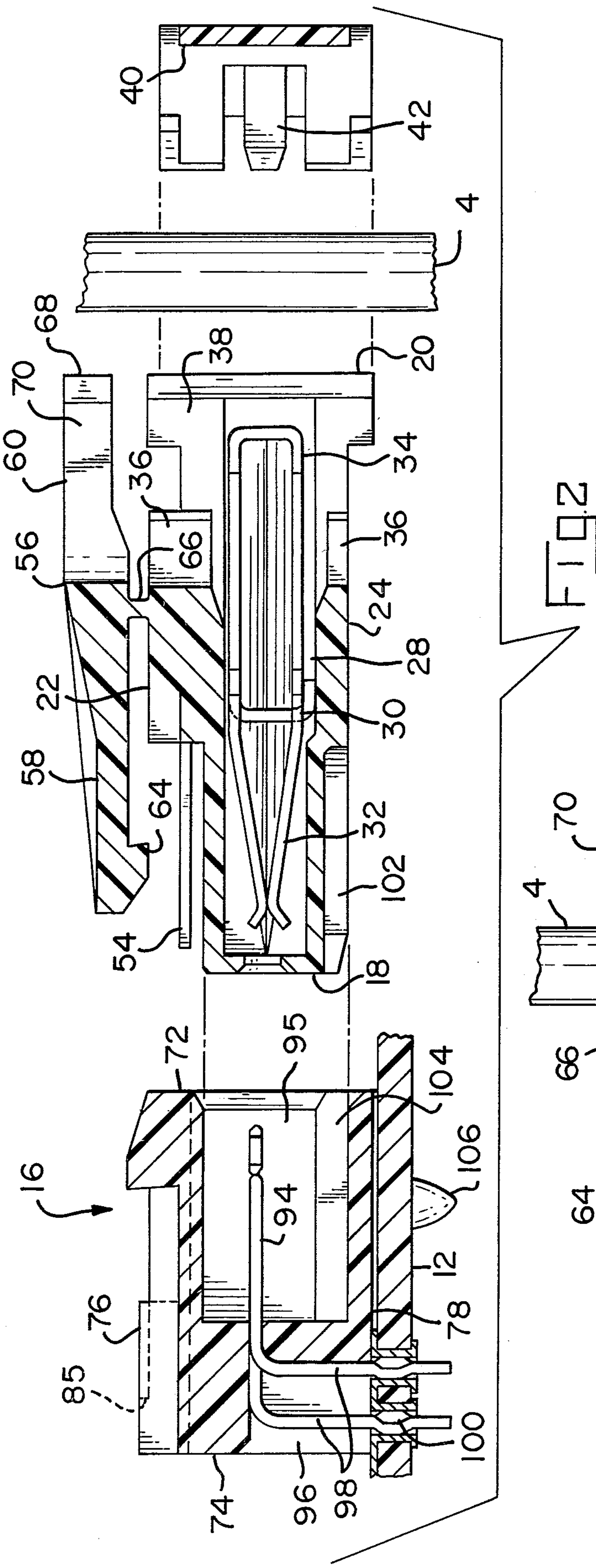
FIG. 2 is a view taken along the lines 2—2 of FIG. 1.
Figure 4:
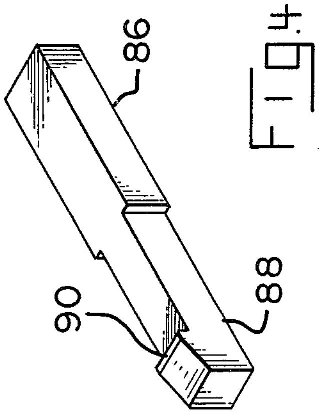
FIG. 4 is a perspective view of a key plug.
Figure 3:
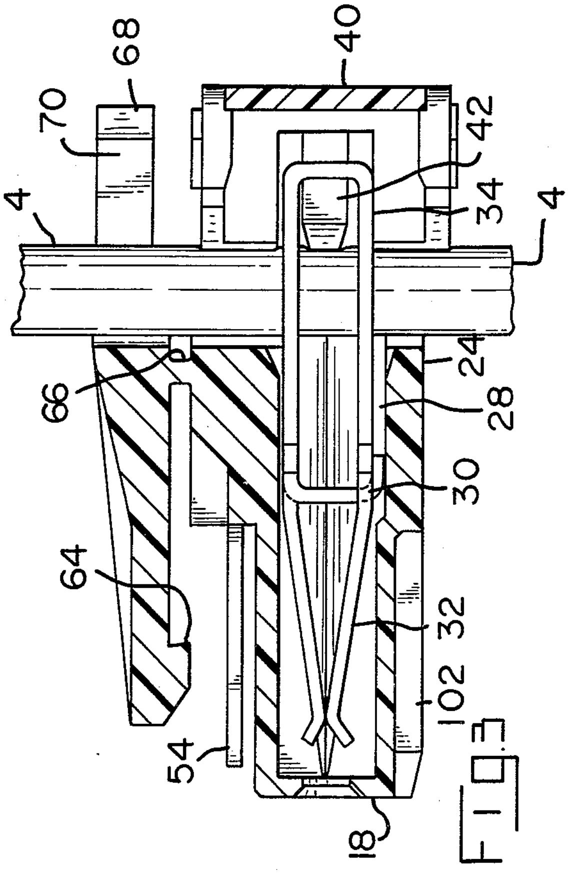
FIG. 3 is a cross-sectional view of the plug housing showing the positions of the parts when the wires are inserted into the terminals and the closure is assembled to the plug housing.

The plug housing comprises a one piece molded part having a mating or face end 18, a rearward face 20, upper and lower sidewalls as viewed in FIG. 2 22, 24, and oppositely facing endwalls 26. A plurality of terminal receiving cavities 28 extend inwardly from the rearward face 20 to the mating face 18 and each cavity has a terminal 30 therein. Terminals of the type shown at 30 are described more fully in Application Ser. No. 271,468, now U.S. Pat. No. 4,408,824. Each terminal has a pair of spring arms 32 at its forward end which receive a blade like terminal 94 in the receptacle housing 16. At its rearward end 34, each terminal has a pair of parallel plate-like sections connected by spaced apart connecting straps, each plate-like member having a slot for receiving a wire 4 upon movement of the wire laterally of its axis and into the slots as shown in FIG. 3. The upper and lower sidewalls have wire-admitting slots 36 which provide clearance for the wires as also shown in FIG. 3.

The wires 4 can be pushed into the wire-receiving slots by assembling a closure member 40 to the rearward face of the housing as described in U.S. patent application Ser. No. 271,491, now U.S. Pat. No. 4,405,193. The closure member has spaced apart sidewalls 44 and has wire-pushing projections 42 between these sidewalls. The closure member is dimensioned to be fitted into the rearward portion of the housing and to be fitted between the end portions 38 of the endwalls 26. The closure 40 has latch ears 46 on the sidewalls 44 which cooperate with latch ears 48 in the housing thereby to retain the closure in its assembled relationship shown in FIG. 3.

Figure 1:
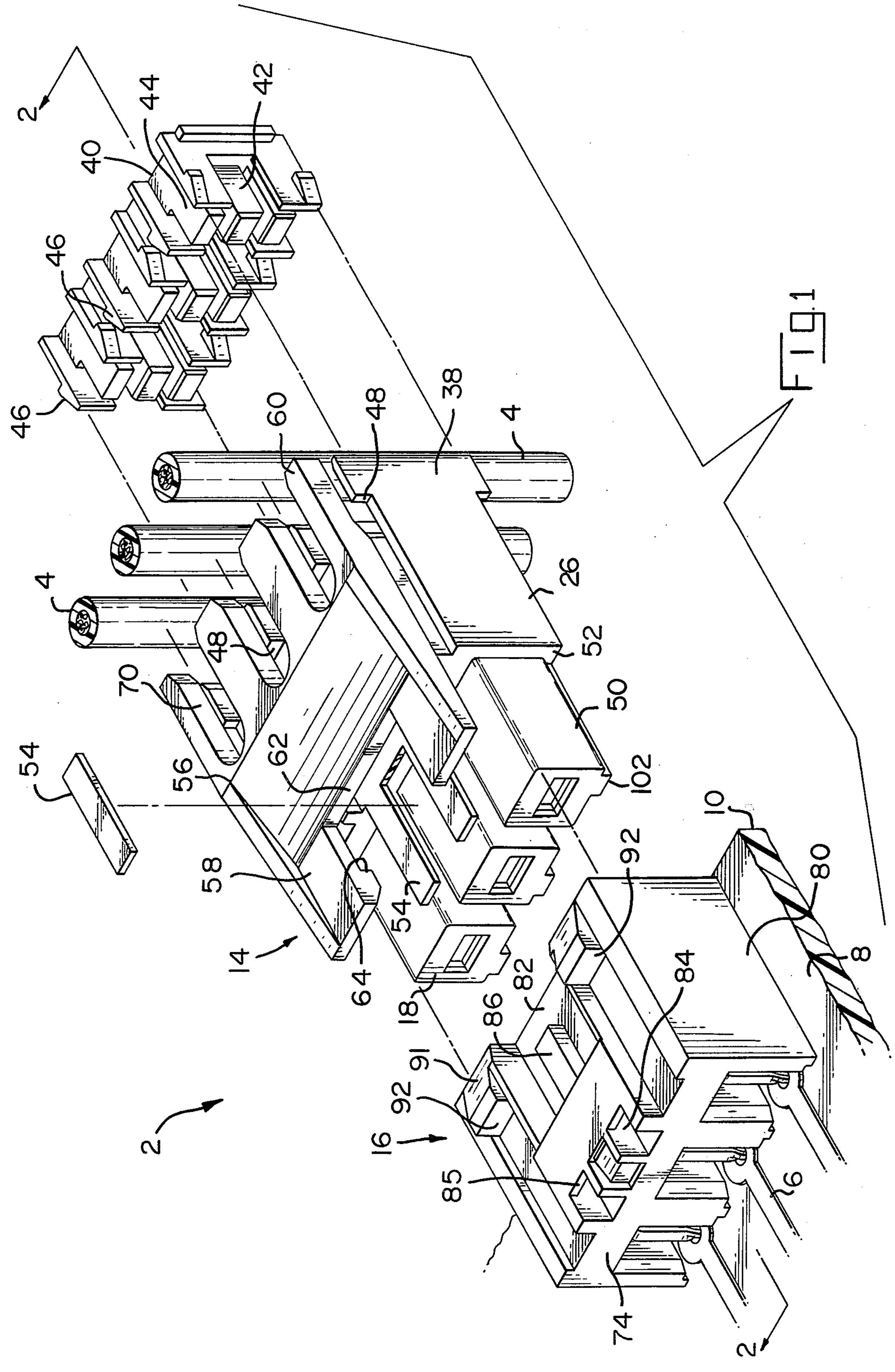
FIG. 1 is a perspective view of a connector assembly in accordance of the invention showing the plug housing exploded from the receptacle housing and showing the back closure of plug housing exploded from the rearward face of the plug housing.

The forward portion of the plug housing comprises three separate side-by-side housing sections 50 which extend from an intermediate forwardly facing shoulder surface 52. A plurality of removable keys 54 extend from the surface 52 above the upper surfaces of the housing sections 50. The keys 54 are integrally molded with the housing and can be easily removed by simply bending a key laterally until it fractures at its base as indicated in FIG. 1. The keys are received in keyways 84 in the receptacle housing 16 as will be described below.

A latch arm 56 is positioned above the surface of the sidewall 22 and is hinged to this sidewall by integral hinge means as shown at 66. The latch arm has a forward portion 58 which extends towards the mating face and over the keys 54 and a rearward portion 60 which extends substantially to the rearward face 20 of the housing. A central inspection opening 62 is provided in the forward portion 58 so that the presence or absence of the keys 54 can be immediately determined. The latch arm has rearwardly facing shoulders 64 adjacent to its side edges on each side of the opening 62. These shoulders cooperate with shoulders 92 on the receptacle housing 16 when the parts are in a mated condition.

The rearward portion 60 of the latch arm has a free end 68 and has a plurality of clearance openings 70 extending inwardly from the free end. These clearance openings are in alignment with the wire-admitting slots 36 and are dimensioned to provide a generous clearance for the wires 4 so that the rearward end can be pushed downwardly from the position shown in FIG. 3 with the plug housing for being coupled to or uncoupled from the receptacle housing.

The receptacle housing 16 has a mating face 72, a rearward face 74, upper and lower sidewalls 76, 78, and oppositely facing endwalls 80. A central recess 82 is provided on the upper sidewall which receives the keys 54 when the parts are mated. The recess 82 extends partially across the upper sidewall and to three side-by-side keyways 84 that extend to the rearward face 74. The upper sidewall is cut away at the ends of these keyways to provide rearwardly facing shoulders 85 that cooperate with shoulders 90 on key plugs 86.

The rearwardly facing shoulders 92 are on each side of the key receiving recess 82 and have forward ramp portions 91 which flex the forward portion of the latch arm upwardly when the parts are brought into engagement until the shoulders 64 move past the shoulders 92 at which time the latch arm returns to its normal position and the parts are latched to each other.

The terminals 94 in the receptacle housing 16 have blade portions which are disposed in recesses 95 that extend inwardly from the mating face 72. These terminals extend through the housing and into a recess 96 in the rearward face 74. Each terminal is sheared at its rearward end to provide three post portions 98 that extend through openings in the circuit board 10. The post portions each have a compliant portion 100 which establishes contact with plated holes in the circuit board as shown in FIG. 2. The three post portions are provided for the reason that the terminals 94 are of relatively heavy gauge metal and are intended to carry a fairly high current. The three post portions 98 provide a strong mechanical connection to the circuit board as well as the required capacity to conduct the current. The receptacle housing shown also has an integral mounting post 106 which extends through an opening in the circuit board and secures the housing to the circuit board independently of the terminal post 98.

The plug and receptacle housing have endwalls 26, 80 which extend normally of the housing sidewalls and the latch arm 56 has side edges which are substantially coplanar with the endwalls of the plug housing. Housings in accordance with the disclosed embodiment can be mounted on circuit boards or in panels in stacked relationship to identical housings with the endwalls of adjacent housing tightly against each other. When connector assemblies are mounted in this closely stacked relationship, it is possible to insert a plug housing into the recesses 95 of two adjacent receptacle housings. In order to prevent such mis-mating, a supplementary keying means is provided in the form of ribs 102 on the lower surfaces of the housing sections 50 which are received in slots 104 in the floors or lower surfaces of the recesses 95. The keying ribs 102 are off center with respect to the housing sections as shown and it will be apparent that mis-mating of one plug housing with two adjacent receptacle housings cannot take place.

If it is desired to key a particular plug housing to a particular receptacle housing, it is merely necessary to break off one of the keys 54 and to insert a key plug 86 into the corresponding keyway of the receptacle housing. The key plug 86 has a forward portion 88 that is dimensioned to be received in the keyway and has a shoulder 90 for cooperation with the shoulder 85 of the keyway. A portion of the key plug will extend across the surface of the recess 82 and a visual indication of the keying code will be apparent from an inspection of the key plug and of the position of the removed key in the plug.

It will be apparent from the foregoing that the invention achieves both a keying system and a latching system on one of the sidewalls of the parts of connector assembly and that very little is added to the overall dimensions of the housings for the keying system and the latching system. It will also be apparent that the latch arm is designed in a way such that insulation displacement wire slot type connections can be used in the terminals in that the latch arm extends beyond the wires as shown in FIG. 3 and has clearance slots for the accomodation of the wires.

I claim:

1. An electrical connector assembly of the type comprising first and second connector housings, each of the housings having a mating face and a rearward face which faces oppositely with respect to the mating face, external housing walls extending from the mating face to the rearward face, the external walls comprising oppositely facing sidewalls and oppositely facing endwalls, terminals in the housings which are coupled to each other when the housings are mated with each other, a latch arm on one of the external housing walls of the first housing, the latch arm being hinged to the one housing wall and having a forward portion which extends towards the mating face and a rearward portion which extends towards the rearward face, and forward portion having latching shoulder means thereon for cooperation with complementary latching shoulder means on the second housing, and a keying system on the housings for keying the housings to each other, the connector assembly being characterized in that:

- the keying system comprises at least one removable key on the first housing and a keyway in the second housing, the key extending parallel to, and being adjacent to, the one external wall of the first housing, the key being substantially coextensive with the forward portion of the latch arm and the key being between the forward portion of the latch arm and the one external wall of the first housing,
- the forward portion of the latch arm having an inspection opening therein to permit determination of the presence or absence of the removable key whereby, the first and second housings can be keyed to each other by removing the key from the first housing and placing a key plug in the keyway of the second housing.

2. An electrical connector assembly as set forth in claim 1 characterized in that the latch arm is hinged to one of the sidewalls of the first housing and has a width which is substantially equal to the width of the first housing as measured between the endwalls thereof, the removable key being located centrally between the endwalls of the first housing.

3. An electrical connector assembly as set forth in claim 2 characterized in that the first housing has a plurality of removable keys thereon, the inspection opening being a single opening located centrally between the side edges of the forward portion of the latch arm.

4. An electrical connector assembly as set forth in claim 3 characterized in that the latching shoulder means comprises a pair of spaced apart latching shoulders, the inspection opening being between the latching shoulders.

5. An electrical connector assembly as set forth in claim 4 characterized in that the first housing is a plug housing and the second housing is a receptacle housing, the receptacle housing having a plurality of side-by-side receptacle recesses therein, the plug housing having forward portions, the forward portions comprising side-by-side spaced apart housing sections, each of the housing sections being dimensioned to be received in one of the recesses, the keying system further comprising at least one keying rib integrally molded on the plug housing and at least one rib-receiving recess in the receptacle housing, the keying rib and the rib-receiving recess each extending from the mating face of its respective housing towards the rearward face thereof, the rib and rib-receiving recess being effective to prevent insertion of the plug housing into two receptacle housings which are stacked against each other in side-by-side relationship.

6. An electrical connector assembly as set forth in either of claims 2 or 4 characterized in that the first housing has a plurality of terminals therein in side-by-side spaced apart relationship, the terminals forming a row which extends between the endwalls of the first housing, each terminal having a wire-receiving portion which is proximate to, and spaced inwardly of the housing from the one sidewall of the first housing, the one sidewall having wire-admitting slots therein which are aligned with the wire-receiving portions of the terminals whereby wires can be moved laterally of their axes and into the wire-receiving portions of the terminals and the wires will then extend through the wire-admitting slots, the rearward portion of the latch arm extending past the wire-admitting slots and having a rearward free end which is proximate to the rearward face of the housing, and wire clearance slots extending into the rearward end of the latch arm from the rearward end thereof, the wire clearance slots being in alignment with the wire-admitting slots in the one sidewall.

7. An electrical connector assembly as set forth in claim 6 characterized in that the second housing is mounted on one surface of a panel-like member such as a circuit board.

8. An electrical connector assembly as set forth in claim 7 characterized in that the other sidewall of the first housing has wire-admitting slots therein whereby wires can be connected to the terminals in the first housing intermediate the ends of the wires.

* * * * *